United States Patent
Toyoshima et al.

(10) Patent No.: US 6,271,687 B1
(45) Date of Patent: *Aug. 7, 2001

(54) SENSE AMPLIFIER CIRCUIT

(75) Inventors: Hiroshi Toyoshima, Akiruno; Masashige Harada, Fuchū ; Tomohiro Nagano, Akishima; Yoji Nishio, Hitachi; Atsushi Hiraishi, Kodaira; Kunihiro Komiyaji, Hachioji; Hideharu Yahata, Chofu; Kenichi Fukui, Kodaira; Hirofumi Zushi, Fussa; Takahiro Sonoda, Fuchū ; Haruko Kawachino, Urawa; Sadayuki Morita, Higashi-Yamato, all of (JP)

(73) Assignees: Hitachi, Ltd.; Hitachi ULSI Engineering Corp., both of Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/531,530

(22) Filed: Mar. 21, 2000

Related U.S. Application Data

(63) Continuation of application No. 09/188,369, filed on Nov. 10, 1998, now Pat. No. 6,046,609, which is a continuation of application No. 08/842,536, filed on Apr. 15, 1997, now Pat. No. 5,854,562.

(30) Foreign Application Priority Data

Apr. 17, 1996 (JP) .................................................. 8-094992
Dec. 17, 1996 (JP) .................................................. 8-336587

(51) Int. Cl.$^7$ ............................................................ G11C 7/06
(52) U.S. Cl. ................................................. 327/55; 327/57
(58) Field of Search ............................................... 327/51–57

(56) References Cited

U.S. PATENT DOCUMENTS

| | | | |
|---|---|---|---|
| 4,504,748 | 3/1985 | Oritani | 327/53 |
| 4,843,264 | 6/1989 | Galbraith | 327/55 |
| 4,973,864 | 11/1990 | Nogami | 327/55 |
| 5,506,524 | 4/1996 | Lin | 327/57 |
| 5,508,644 | 4/1996 | Branson et al. | 327/57 |
| 5,526,314 | 6/1996 | Kumar | 327/57 |
| 5,729,159 | 3/1998 | Gersbach | 327/52 |
| 5,796,273 | 8/1998 | Jung et al. | 327/55 |
| 5,903,171 | * 5/1999 | Shieh | 327/55 |
| 6,002,270 | * 12/1999 | Timoc | 327/55 |

FOREIGN PATENT DOCUMENTS 5-298887  11/1993  (JP) .

OTHER PUBLICATIONS

T. Kobayashi et al, "A Current–Mode Latch Sense Amplifier and a Static Power Saving Input Buffer for Low–Power Architecture", 1992 Symposium on VLSI Circuits Digest of Technical Papers, 1992, pp. 28–29.

* cited by examiner

Primary Examiner—Toan Tran
(74) Attorney, Agent, or Firm—Mattingly, Stanger & Malur, P.C.

(57) ABSTRACT

A sense amplifier, which is intended to reduce the output response time after it has received a small voltage difference until it delivers amplified output signals, consists of a latch circuit made up of a pair of CMOS inverters, a pair of NMOS transistors connected in parallel to the latch circuit, and a current source connected in series to the latch circuit and NMOS transistor pair. The NMOS transistors amplify a small voltage difference of input signals, and the inverters of the latch circuit further amplify the resulting voltage difference to produce the output signals. Based on a small voltage difference of input signals being amplified in two stages and the amplifying circuit being 2-stage serial connection of the current source and the NMOS transistor or CMOS inverter, the delay time of output response can be reduced.

10 Claims, 14 Drawing Sheets

SENSE AMPLIFIER CIRCUIT

This is a continuation application of U.S. Ser. No. 09/188,369, filed Nov. 10, 1998, now U.S. Pat. No. 6,046, 609, which is a continuation application of U.S. Ser. No. 08/842,536, filed Apr. 15, 1997, now U.S. Pat. No. 5,854, 562.

BACKGROUND OF THE INVENTION

The present invention relates to a semiconductor integrated circuit having a differential amplifier which amplifies a small signal, and particularly to a circuit arrangement of a sense amplifier used suitably in a static RAM (Random Access Memory).

There has been known this kind of sense amplifier having a circuit arrangement on a semiconductor chip as shown in FIG. 3. In the figure, reference symbols CDB02, CDT02, SAEQB02 and SACM02 denote external input signals supplied to the sense amplifier, STB02 and STT02 are nodes for output signal lead-out, VCC is a supply voltage, and GND is a ground voltage.

Among the input signals, the CDB02 is fed to the gate of an NMOS transistor MN203, the CDT02 is fed to the gate of an NMOS transistor MN204, the SAEQB02 is fed to the gates of PMOS transistors MP201, MP202, MP203, MP206, MP207 and MP208, and the SACM02 is fed to the gate of an NMOS transistor MN205. The supply voltage VCC is fed to the sources of the PMOS transistors MP201, MP202, MP204, MP205, MP206 and MP207. The node STT02 is connected to the node of drains (joint drains) of the PMOS transistor MP205 and NMOS transistor MN202, the joint gates of the PMOS transistor MP204 and NMOS transistor MN201, and the drain of the PMOS transistor MP201.

The PMOS transistor MP203 has its drain-source path connected between the gates of the PMOS transistors MP204 and MP205. The node STB02 is connected to the joint drains of the PMOS transistor MP204 and NMOS transistor MN201, the joint gates of the PMOS transistor MP205 and NMOS transistor MN202, and the drain of the PMOS transistor MP202. The PMOS transistors MP206 and MP207 have their drains connected to the drains of the transistors MN203 and MN204, respectively.

The PMOS transistor MP208 has its drain-source path connected between the drains of the NMOS transistors MN203 and MN204. The NMOS transistors MN203 and MN204, with their sources connected together, have their drains connected to the sources of the NMOS transistors MN201 and MN202, respectively. The NMOS transistor MN205 has its source grounded, its drain connected to the joint sources of the NMOS transistors MN203 and MN204, and its gate supplied with the signal SACM02.

In this conventional sense amplifier, the NMOS transistor MN205 serves as a current source, and a pair of NMOS transistors MN203 and MN204 connected to the current source form a differential circuit. The PMOS transistor MP204 and NMOS transistor MN201 form one inverter and the PMOS transistor MP205 and NMOS transistor MN202 form another inverter, with these inverters forming a latch circuit. Accordingly, this sense amplifier is a 3-stage serial connection of the latch circuit, differential circuit and current source.

Normally, the input signal SAEQB02 is "low", causing the PMOS transistors MP203 and MP208 to equalize and reset the nodes STB02 and STT02 to the supply voltage VCC, and the activation signal SACM02 is "low" so that the sense amplifier stays inactive.

FIG. 4 shows the operating waveforms of this conventional sense amplifier. At a time when a small voltage difference arises between the input signals CDT02 and CDB02, e.g., the CDT02 voltage is VCC and the CDB02 voltage is VCC-V1 (V1<VCC), the signal SAEQB02 is brought to "high" and subsequently the signal SACM02 is brought to "high". Consequently, a current I1 flows through the NMOS transistor MN204 and a current I1–I2 (I1>I2) flows through the NMOS transistor MN203.

Since the nodes STB02 and STT02 are reset to the voltage VCC, the currents I1 and I1–I2 flow through the NMOS transistors MN202 and MN201, respectively, resulting in a slight voltage difference emerging between the nodes STB02 and STT02 (STB02 voltage becomes lower than STT02 voltage). This voltage difference is amplified by the latch circuit formed of the PMOS transistors MP204 and MP205 and NMOS transistors MN201 and MN202, resulting in an amplified voltage difference produced between the nodes STB02 and STT02.

At the time of arise of a small voltage difference between the input signals CDT02 and CBD02, the signal SACM02 is brought to "high", as mentioned above, thereby to activate the sense amplifier, and the reset signal SAEQB02 is brought to "high". Consequently, currents flow through the NMOS transistors MN203 and MN204 having the input signals CDT02 and CDB02. The values of these currents depend on the difference of gate voltages of the transistors MN203 and MN204. The current difference causes the latch circuit to produce output signals, which are amplified voltages of the input signals CDT02 and CBD02, on the nodes STB02 and STT02.

A sense amplifier having the foregoing arrangement is described in publication: 1992 Symposium on VLSI Circuits Digest of Technical Papers, pp.28–29, for example.

U.S. Pat. No. 4,504,748 discloses in its FIG. 6 another sense amplifier.

Japanese patent publication JP-A-Hei-5-298887 shows in its FIG. 12 a sense amplifier, which operates such that the amplifier is rid of equalization in response to the output of data from the DRAM memory cell, and the data is introduced through joint-source PMOS transistors P1 and P2 located at the front of the latch circuit.

In regard to the conventional sense amplifier shown in FIG. 3, in which the differential circuit and latch circuit are connected in series, the current on the node STB02 (or STT02) is drawn by way of the NMOS transistors MN201 and MN203 (or MN202 and MN204), i.e., three series NMOS transistors inclusive of the current source transistor MN205, and the high-resistance current path results in an extended output response time on the node STB02 (or STT02). Specifically, as an example of application of this sense amplifier, a cache memory formed of a static RAM operating at a read cycle of 66 MHz takes an output response time of about 2.0 ns. In order to accomplish a cache memory which operates as fast as 100 MHz or higher, a sense amplifier having an output delay time of 1.5 ns or less is required.

The sense amplifier described in the U.S. Pat. No. 4,504, 748 does not use a latch circuit formed by CMOS inverters, and therefore a small output voltage amplitude results in a slower signal propagation to the next stage.

In regard to the sense amplifier described in the JP-A-Hei-5-298887, the joint-source PMOS transistors P1 and P2 forming the input section of the sense amplifier do not have a common current source, and thus the input section does not have a differential input configuration. On this account, the sense amplifier suffers a smaller operational margin in terms of the input voltage amplitude and a limited amplification, and therefore it cannot deliver an amplified signal of data from a memory cell at a high speed.

A large number of sense amplifiers are used in a memory, and they take up a large proportion of the chip area (e.g., 5% area for a 1M-bit cache memory), and therefore besides the achievement of speed-up without increased power consumption, the reduction of the number of transistors used to form a sense amplifier thereby to reduce the chip area is also desired.

SUMMARY OF THE INVENTION

Accordingly, an object of the present invention is to provide a semiconductor integrated circuit for a sense amplifier capable of reducing the output delay time which is the time length after the sense amplifier is activated and the reset signal (SAEQB02) is removed until the amplifier output responses.

Another object of the present invention is to provide a semiconductor integrated circuit for a sense amplifier capable of reducing the output delay time without imposing an increased power consumption, and reducing the number of constituent elements thereby to reduce the chip area.

In order to achieve the above objects, the present invention resides in a semiconductor integrated circuit comprising a differential amplifying circuit formed of first and second NMOS transistors, with their sources connected together, for amplifying a voltage difference between first and second input signals, i.e., specifically, NMOS transistors MN101 and MN102 for amplifying a voltage difference of input signals CDB01 and CDT01 in FIG. 1, a current source connected to the joint sources of the first and second NMOS transistors, and a latch circuit made up of a first CMOS inverter which is supplied on its input with the output of the differential amplifying circuit corresponding to the second input signal and is connected to a first power line, i.e., supply voltage VCC, and a second CMOS inverter which is supplied on its input with the output of the differential amplifying circuit corresponding to the first input signal and is connected to the first power line, the first and second CMOS inverters having their outputs connected to the inputs of the second and first CMOS inverters, respectively, and being connected in series to the current source.

The first CMOS inverter is formed of a first PMOS transistor, i.e., MP104 in FIG. 1, having its source connected to the first power line and a third NMOS transistor, i.e., MN103, having its drain connected to the drain of the first PMOS transistor. The second CMOS inverter is formed of a second PMOS transistor, i.e., MP105, having its source connected to the first power line and a fourth NMOS transistor, i.e., MN104, having its drain connected to the drain of the second PMOS transistor. The current source is formed of a fifth NMOS transistor, i.e., MN105, having its source connected to a second power line, i.e., ground voltage GND, its gate supplied with a third input signal, i.e., SACM01, and its drain connected to the sources of the first and second NMOS transistors.

Preferably, the circuit further includes a third PMOS transistor, i.e., MP101 in FIG. 1, having its drain connected to the gates of the first PMOS transistor and the third NMOS transistor, the drains of the second PMOS transistor and the second and fourth NMOS transistors, a fourth PMOS transistor, i.e., MP102, having its drain connected to the gates of the second PMOS transistor and the fourth NMOS transistor, the drains of the first PMOS transistor and the first and third NMOS transistors, and a fifth PMOS transistor, i.e., MP103 having its drain-source path connected between the gates of the first and second PMOS transistors, with the third, fourth and fifth PMOS transistors being supplied on their gates with a fourth input signal, i.e., SAEQB01.

Alternatively, the circuit further includes a sixth NMOS transistor connected between the first NMOS transistor of the differential amplifying circuit and the current source, i.e., MN106 connected between the MN101 and the current source MN105 in FIG. 6, and supplied on its gate with the output signal of the second CMOS inverter of the latch circuit, and a seventh NMOS transistor connected between the second NMOS transistor of the differential amplifying circuit and the current source, i.e., MN107 connected between the MN102 and the current source MN105, and supplied on its gate with the output signal of the first CMOS inverter of the latch circuit.

Preferably, the circuit further includes a sixth PMOS transistor having its drain-source path connected between the drains of the sixth and seventh NMOS transistors, i.e., MP106 having its drain-source path connected between the drains of the MN106 and MN107 in FIG. 6, with the sixth PMOS transistor being supplied on its gate with the fourth input signal, i.e., SAEQB01.

These and other objects and features of the present invention will become more apparent from the following description taken in conjunction with the accompanying drawings.

DESCRIPTION OF THE PREFERRED EMBODIMENTS

Preferred embodiments of this invention will be explained with reference to the drawings.

Figure 1:
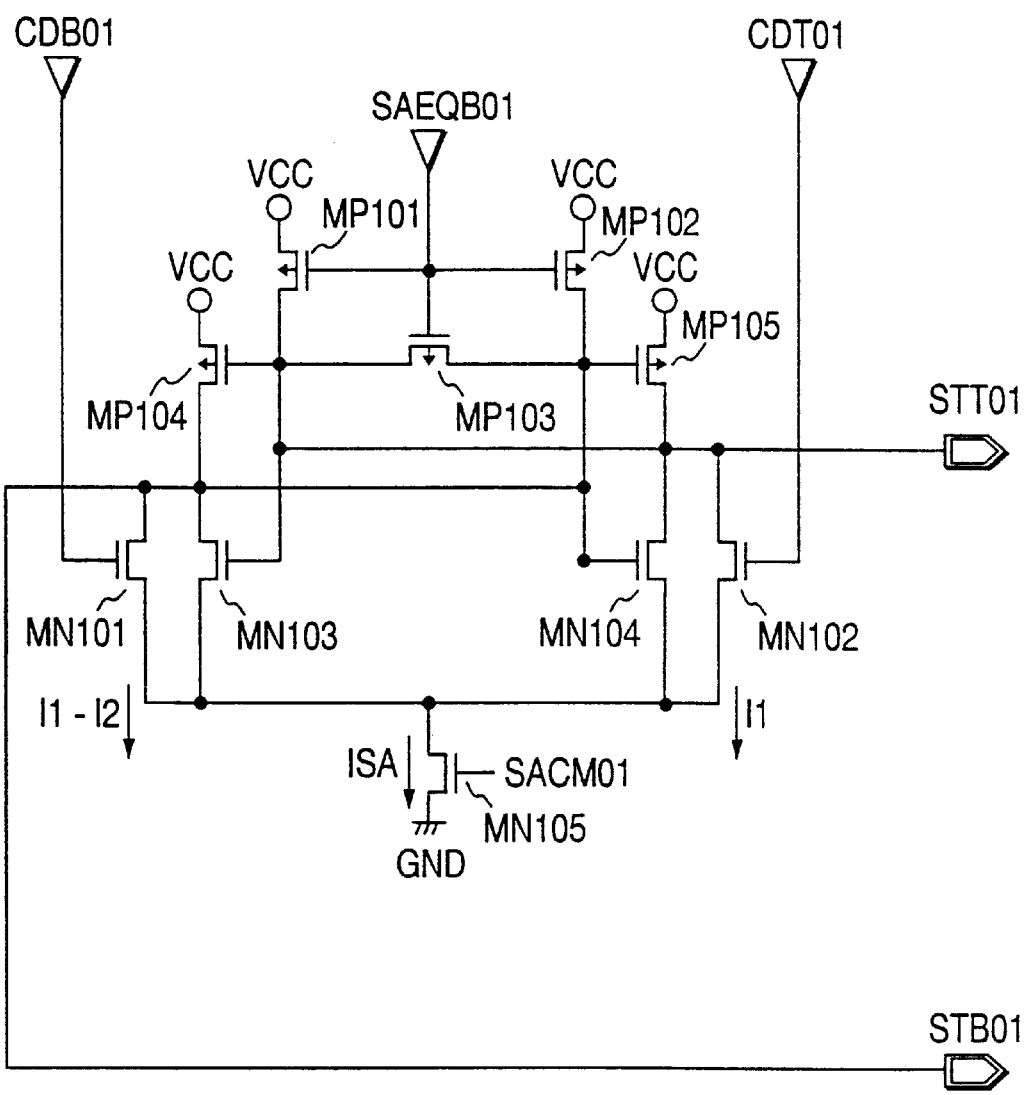
FIG. 1 is a schematic diagram of a sense amplifier accomplished by a semiconductor integrated circuit based on a first embodiment of this invention.

FIG. 1 shows a sense amplifier accomplished by a semiconductor integrated circuit based on the first embodiment of this invention. In the figure, reference symbols CDB01, CDT01, SAEQB01 and SACM01 denote external input signals supplied to the sense amplifier, STB01 and STT01 are nodes for output signal lead-out, VCC is a supply voltage, and GND is a ground voltage.

Among the input signals, the CDB01 is fed to the gate of an NMOS transistor MN101, the CDT01 is fed to the gate of an NMOS transistor MN102, the SAEQB01 is fed to the gates of PMOS transistors MP101, MP102 and MP103, and the SACM01 is fed to the gate of an NMOS transistor MN105. The supply voltage VCC is fed to the sources of the PMOS transistors MP101, MP102, MP104 and MP105. The node STT01 is connected to the joint drains of the PMOS transistor MP105 and NMOS transistor MN104, the joint gates of the PMOS transistor MP104 and NMOS transistor MN103, and the drain of the PMOS transistor MP101.

The PMOS transistor MP103 has its drain-source path connected between the gates of the PMOS transistors MP104 and MP105. The node STB01 is connected to the joint drains of the PMOS transistor MP104 and NMOS transistor MN103, the joint gates of the PMOS transistor MP105 and NMOS transistor MN104, and the drain of the PMOS transistor MP102. The NMOS transistor MN101 has its drain connected to the joint drains of the NMOS transistor MN103 and PMOS transistor MP104, and the joint gates of the NMOS transistor MN104 and PMOS transistor MP105.

The NMOS transistor MN102 has its drain connected to the joint drains of the NMOS transistor MN104 and PMOS transistor MP105 and the joint gates of the NMOS transistor MN103 and PMOS transistor MP104. The NMOS transistor MN105 has its source grounded and its drain connected to the joint sources of the NMOS transistors MN101, MN102 MN103 and MN104.

The sense amplifier of this embodiment consists of a latch circuit which is made up of a CMOS inverter formed of the PMOS transistor MP104 and NMOS transistor MN103 and another CMOS inverter formed of the MP105 and MN104, a differential amplifying circuit formed of the NMOS transistor MN101 connected in parallel to the MN103 of the latch circuit and the NMOS transistor MN102 connected in parallel to the MN104, and a current source which is formed of the NMOS transistor MN105 connected in series to the NMOS transistors MN101, MN102, MN103 and MN104.

The sense amplifier operates as follows. The NMOS transistors MN101 and MN102 amplify a small voltage difference between the input signals CDT01 and CDB01, causing the voltage on the nodes STB01 and STT01 to vary. The NMOS transistors MN103 and MN104 amplify the varied voltages on the nodes STB01 and STT01. This circuit arrangement, in which a small voltage difference between the input signals CDT01 and CDB01 is amplified in two stages and the amplifying circuit is of a 2-stage serial connection of the current source transistor MN105 and transistors MN101 and MN103 (or MN102 and MN104), can reduce the delay time of output response on the node STB01 (or STT01).

Figure 2:
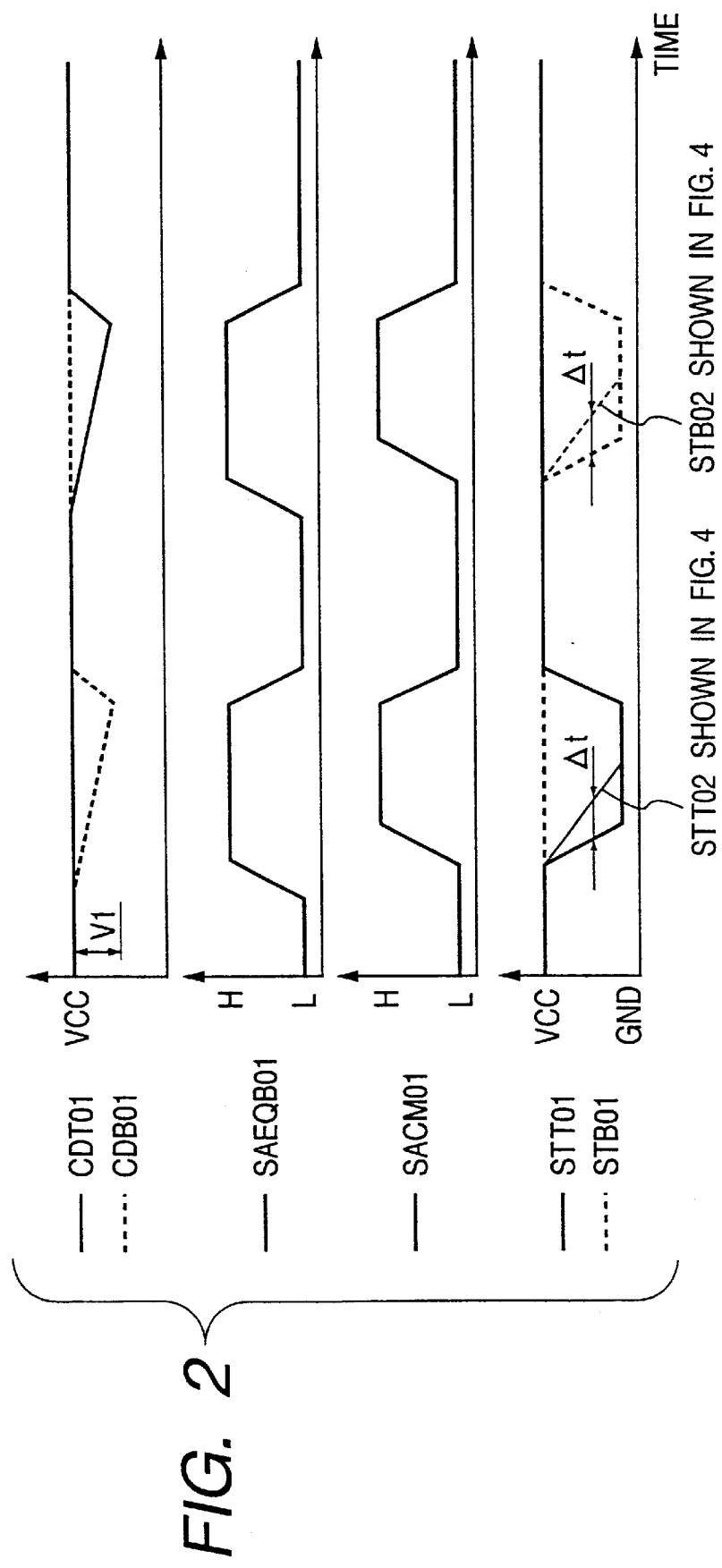
FIG. 2 is a waveform diagram explaining the operation of the sense amplifier shown in FIG. 1.

FIG. 2 shows the signal waveforms of the sense amplifier shown in FIG. 1. Normally, the signals SACM01 and SAEQB01 are "low", causing the nodes STB01 and STT01 to be reset to the VCC voltage. At a time when a small voltage difference arises between the input signals CDT01 and CDB01, e.g., the CDT01 voltage is VCC and the CDB01 voltage is VCC-V1 (V1<VCC), the reset signal SAEQB01 is brought to "high"(i.e., the reset state is lifted), and subsequently the signal SACM01 is brought to "high" (i.e., the sense amplifier is activated). Consequently, a current I1 flows through the NMOS transistor MN102 and a current I1–I2 (I1>I2) flows through the NMOS transistor MN101.

At this time, a small voltage difference emerges between the nodes STB01 and STT01 (STB01 voltage becomes lower than STT01 voltage). This voltage difference is amplified by the latch circuit formed of the PMOS transistors MP104 and MP105 and NMOS transistors MN103 and MN104, resulting in an amplified voltage difference produced between the nodes STB01 and STT01.

Figure 3:
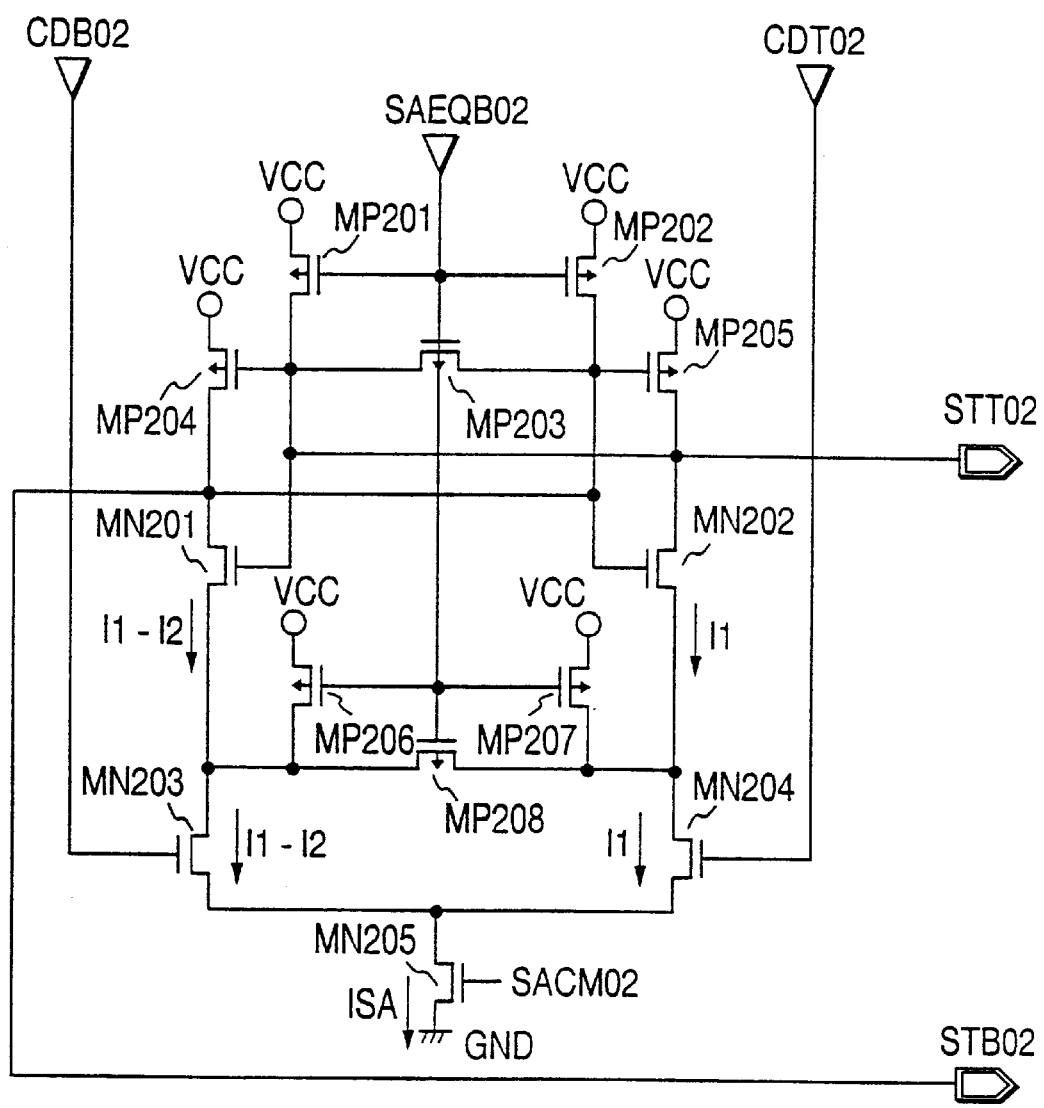
FIG. 3 is a schematic diagram of a conventional sense amplifier.
Figure 4:
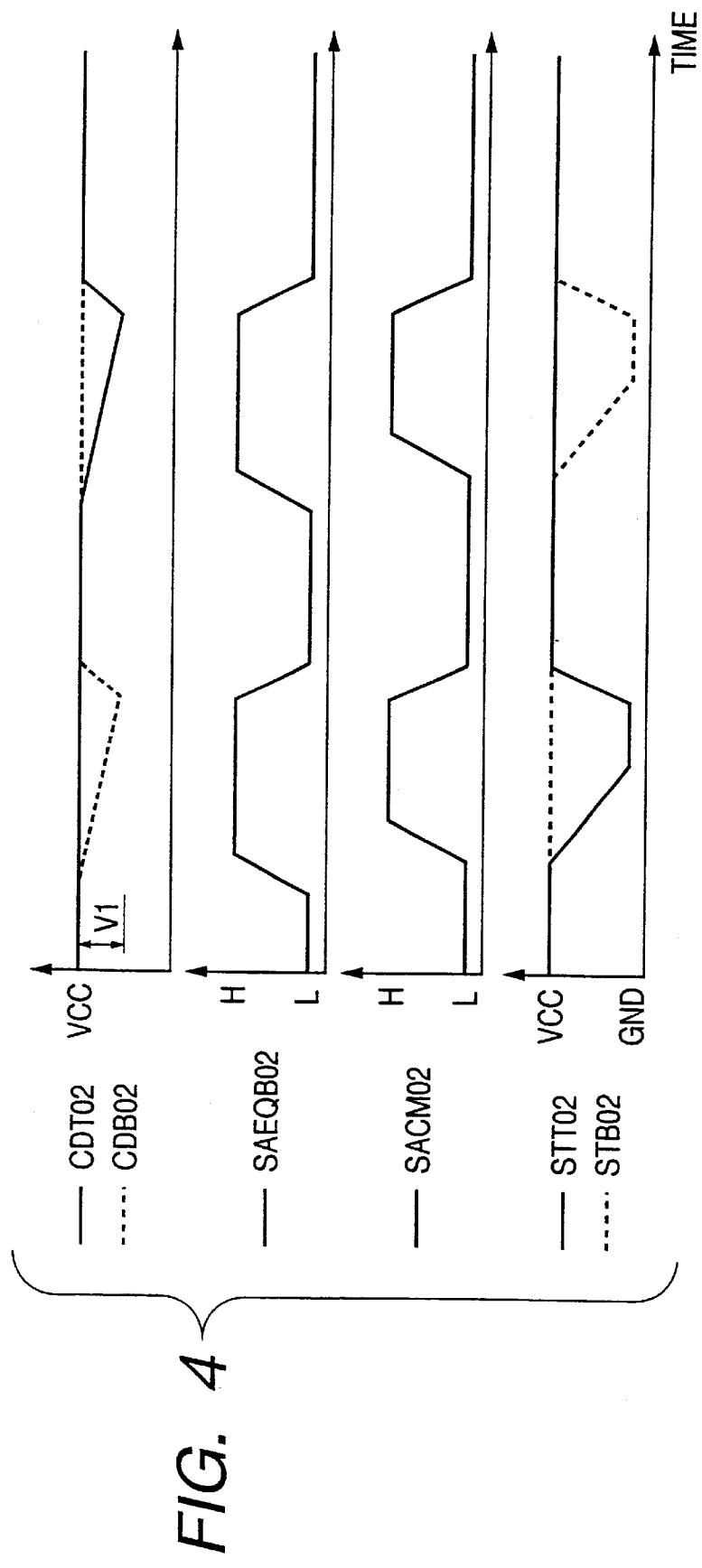
FIG. 4 is a waveform diagram explaining the operation of the conventional sense amplifier shown in FIG. 3.

This sense amplifier is different from the conventional sense amplifier shown in FIG. 3 in that a small voltage difference is amplified in two stages and the amplifying circuit is a 2-stage serial connection of the current source transistor MN105 and transistors MN101 and MN103 (or MN102 and MN104), and it can reduce the delay time of output response on the node STB01 (or STT01) by Δt, as shown in FIG. 2 in contrast to the conventional circuit whose output response is shown in FIG. 4.

It was confirmed that the sense amplifier of this embodiment made from CMOS of 0.4 μm process attains a delay time reduction Δt of 0.6 ns as compared with the conventional sense amplifier. Namely, it operates faster than the conventional sense amplifier.

Figure 5:
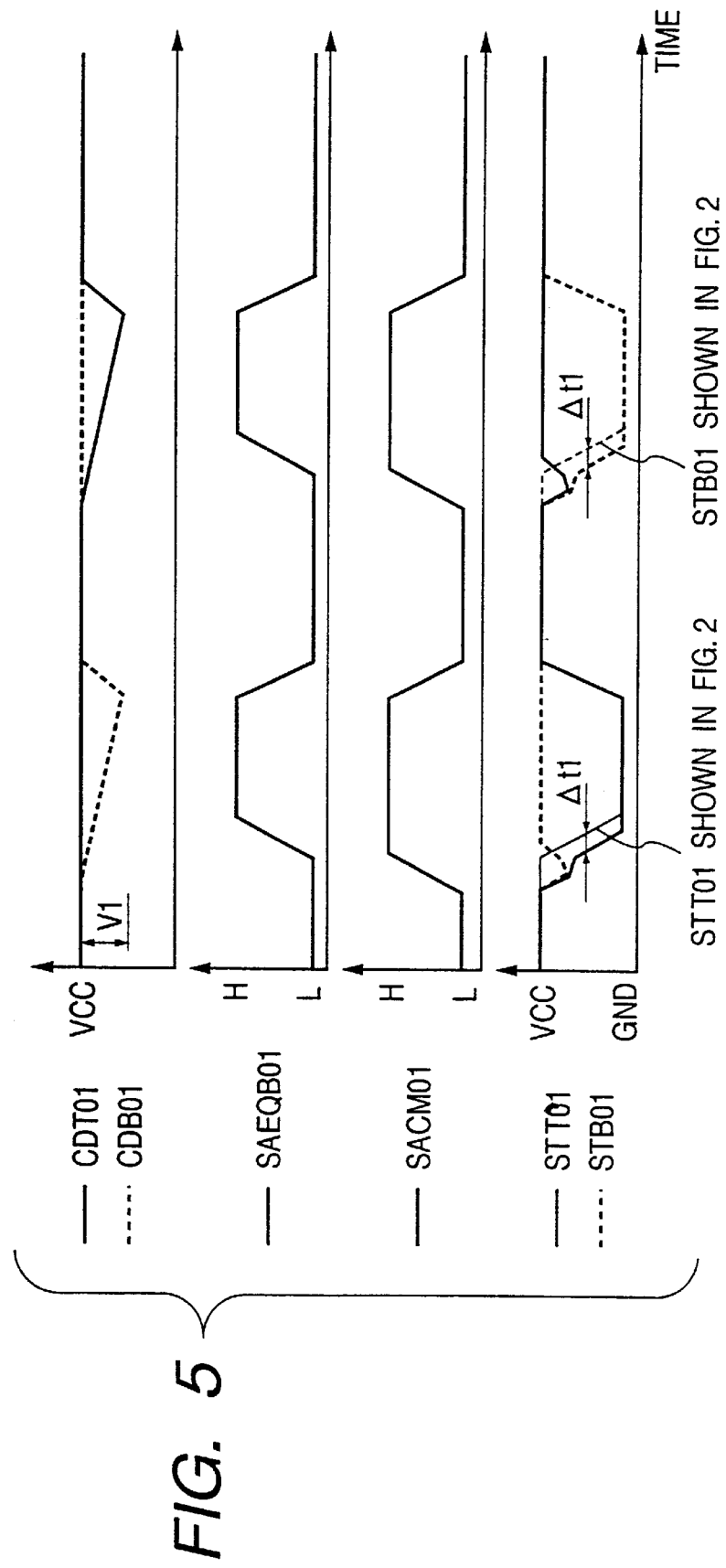
FIG. 5 is a waveform diagram explaining the operation of the sense amplifier shown in FIG. 1.

The sense amplifier of this embodiment shown in FIG. 1 also operates in response to the rises of the SACM01 signal to "high" and next the SAEQB01 signal to "high" (reversed order of rising of the signals against the case of FIG. 2), as shown in FIG. 5.

At a time when a small voltage difference arises between the input signals CDT01 and CDB01, e.g., the CDT01 voltage is VCC and the CDB01 voltage is VCC-V1 (V1<VCC), the signal SACM01 is brought to "high" and next the signal SAEQB01 is brought to "high". In this case, during the period when SACM01 is "high" and SAEQB01 is "low", a current from the power source flows to the PMOS transistors MP101, MP102 and MP103, to the NMOS transistors MN101, MN102, MN103 and MN104, and to the GND, causing the voltage on the nodes STB01 and STT01 to fall below VCC. At the same time, the voltage of the input signal CDB01 begins to fall, creating a voltage difference between the input signals CDT01 and CDB01, and the current of the NMOS transistor MN101 becomes smaller than the current of the NMOS transistor MN102. Consequently, a slight difference emerges in the falling voltage on the nodes STB01 and STT01 (STB01 voltage becomes lower than STT01 voltage).

Subsequently, when the signal SAEQB01 goes "high", the slight voltage difference is amplified by the latch circuit formed of the PMOS transistors MP104 and MP105 and NMOS transistors MN103 and MN104, resulting in an amplified voltage difference between the nodes STB01 and STT01. There is already a voltage difference between the nodes STB01 and STT01, with their voltages being below VCC, when the signal SAEQB01 goes "high", and the delay time of output response on the nodes STB01 and STT01 is reduced by Δt1 as shown in FIG. 5 in contrast to the circuit of FIG. 2 (in which case, SAEQB01 goes "high", and next SACM01 goes "high").

The sense amplifier of this embodiment has its number of transistors reduced to 10 from the conventional sense amplifier of FIG. 3 having 13 transistors, and it contributes significantly to the reduction of chip area for a memory which uses a large number of sense amplifiers.

Figure 6:
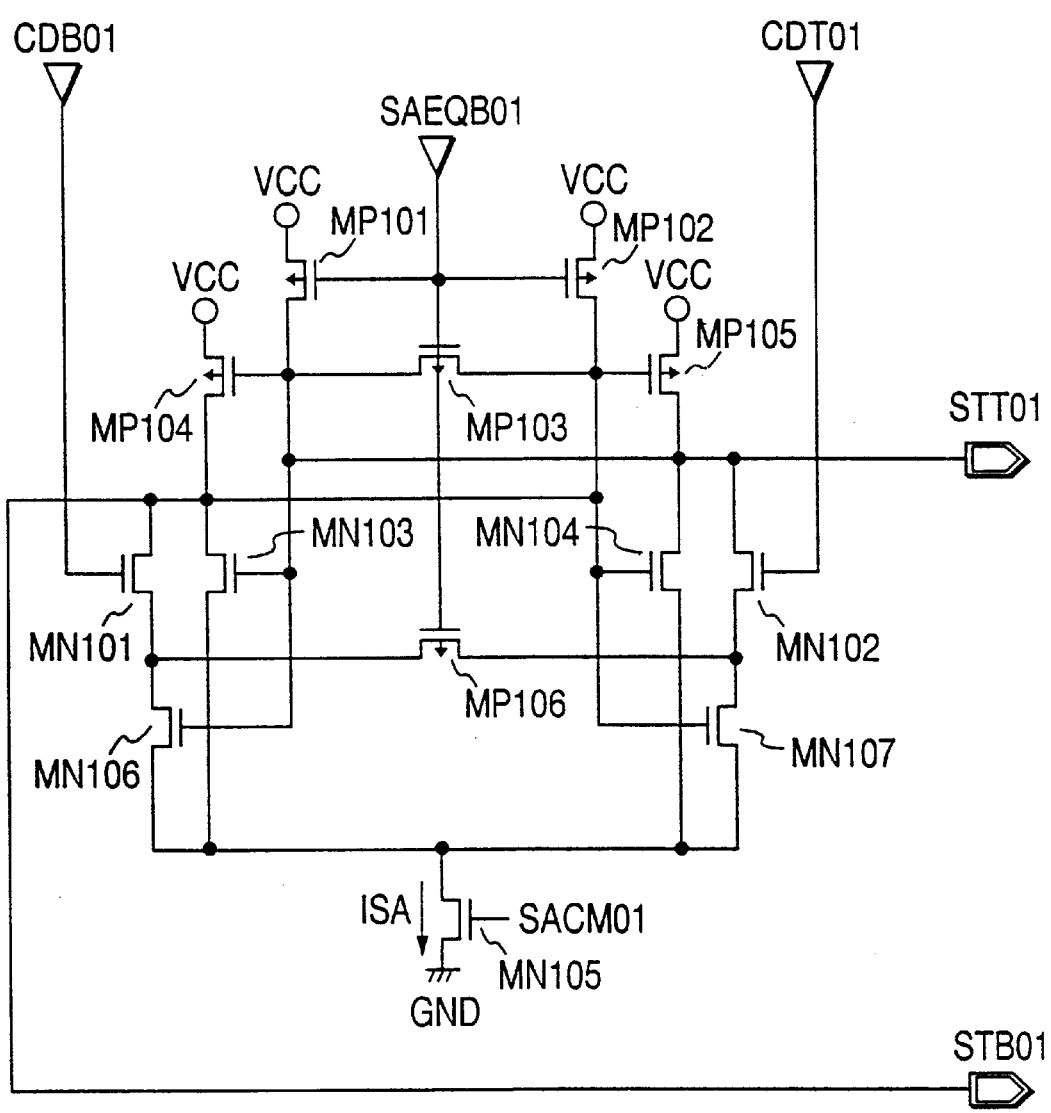
FIG. 6 is a schematic diagram of a sense amplifier accomplished by a semiconductor integrated circuit based on a second embodiment of this invention

FIG. 6 shows a sense amplifier accomplished by a semiconductor integrated circuit based on the second embodiment of this invention. This sense amplifier, which is derived from the first embodiment of FIG. 1, further includes an NMOS transistor MN106 inserted between the NMOS transistors MN105 and MN101 and another NMOS transistor MN107 inserted between the NMOS transistors MN105 and MN102. Specifically, the MN106 and MN107 have their drains connected to the sources of the MN101 and MN102, respectively, and their gates connected to the nodes STT01 and STB01, respectively. The source-grounded NMOS transistor MN105 has its drain connected to the joint sources of the NMOS transistors MN106, MN107, MN103 and MN104. Further included is a PMOS transistor MP106 having its drain and source connected to the node of the source of MN101 and drain of MN106 and the node of the source of MN102 and drain of MN107.

The sense amplifier of this embodiment consists of a latch circuit formed of the PMOS transistors MP104 and MP105 and NMOS transistors MN103 and MN104 connected as shown in FIG. 1, the NMOS transistor MN101 connected in parallel to the MN103 of the latch circuit, the NMOS transistor MN106 connected in parallel to the MN103 and in series to the MN101 (and connected at its gate to the output of the inverter formed of the MP105 and MN104), the NMOS transistor MN102 connected in parallel to the MN104, the NMOS transistor MN107 connected in parallel to the MN104 and in series to the MN102 (and connected at its gate to the output of the inverter formed of the MP104 and MN103), and the NMOS transistor MN105 as a current source connected in series to the MN106, MN107, MN103 and MN104.

This sense amplifier operates similarly to the first embodiment as follows. The NMOS transistors MN101 and MN102 amplify a small voltage difference between the input signals CDT01 and CDB01, causing the voltage on the nodes STB01 and STT01 to vary. The NMOS transistors MN103 and MN104 amplify the varied voltages on the nodes STB01 and STT01. This circuit arrangement, in which a small voltage difference between the input signals CDT01 and CDB01 is amplified in two stages and the amplifying circuit is a 2-stage serial connection of the current source transistor MN105 and transistor MN103 (or MN104), can reduce the delay time of output response on the node STB01 (or STT01).

In addition, during the period after output signals have been led out to the nodes STB01 and STT01, e.g., "low" output to STB01 and "high" output to STT01, until the signals SAEQB01 and SACM01 go "low", the NMOS transistor MN107 having its gate connected to the node STB01 turns off. Namely, the current flowing in this period in the case of the first embodiment from the power source to the PMOS transistor MP105 having its gate connected to the node STB01, to the NMOS transistor MN102 having its gate supplied with the input signal CDT01 ("high"), to the current source NMOS transistor MN105, and to GND can be eliminated. As a result of the addition of the NMOS transistors MN106 and MN107, the power consumption of the sense amplifier can be reduced.

Figure 7:
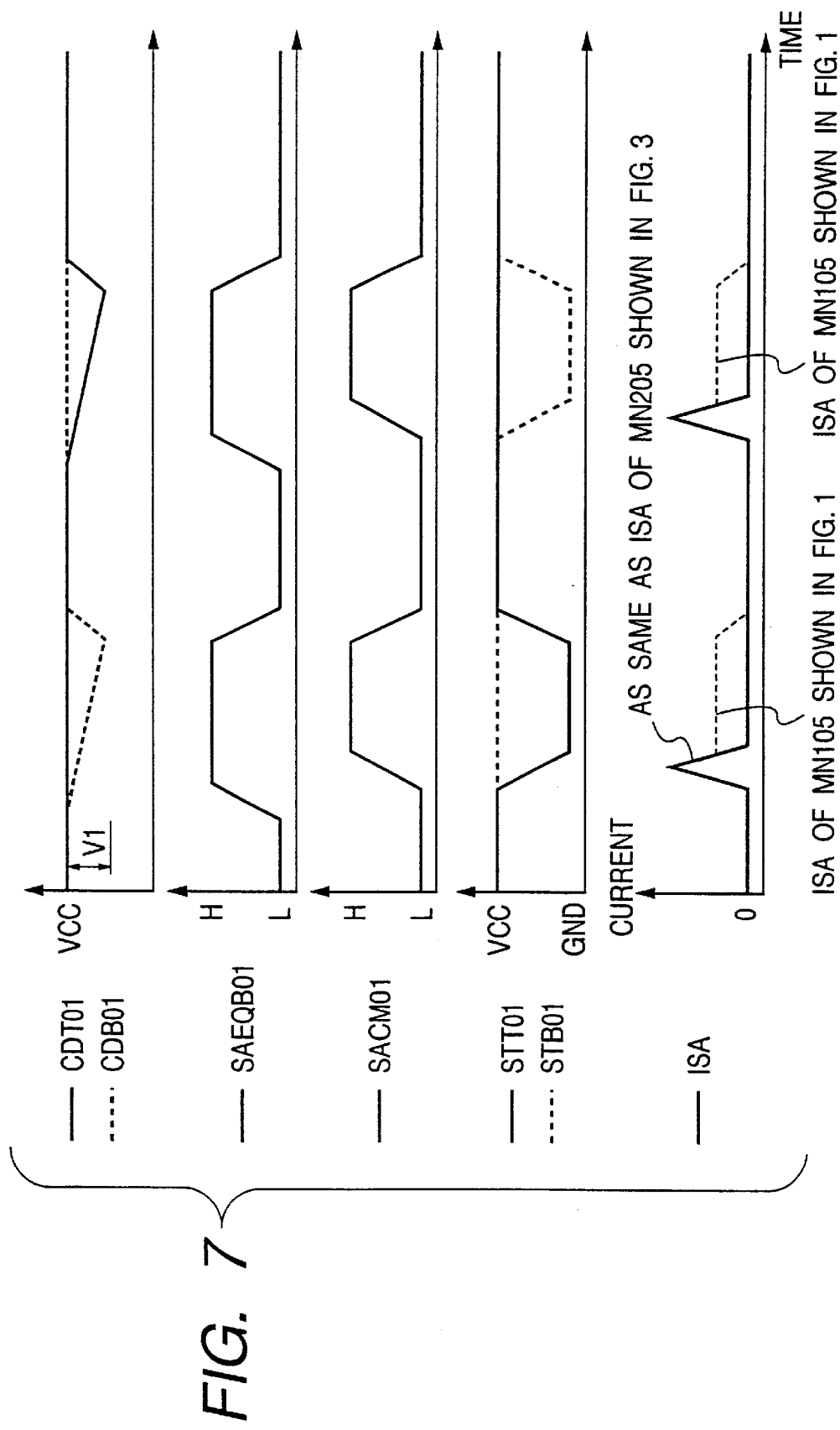
FIG. 7 is a waveform diagram explaining the operation of the sense amplifier shown in FIG. 6.

FIG. 7 shows the signal waveforms of the sense amplifier shown in FIG. 6. Normally, the signals SACM01 and SAEQB01 are "low", causing the nodes STB01 and STT01 to be reset to the VCC voltage. At a time when a small voltage difference arises between the input signals CDT01 and CDB01, the reset signal SAEQB01 is brought to "high" (i.e., the reset state is lifted), and subsequently the signal SACM01 is brought to "high" (i.e., the sense amplifier is activated).

At this time, a small voltage difference emerges between the nodes STB01 and STT01 (STB01 voltage becomes lower than STT01 voltage). This voltage difference is amplified by the latch circuit formed of the PMOS transistors MP104 and MP105 and NMOS transistors MN103 and MN104, resulting in an amplified voltage difference produced between the nodes STB01 and STT01.

This sense amplifier is different from the conventional sense amplifier shown in FIG. 3 in that a small voltage difference is amplified in two stages and the amplifying circuit is a 2-stage serial connection of the current source transistor MN105 and transistor MN103 (or MN104), and it can reduce the delay time of output response on the node STB01 (or STT01).

In addition, during the period after the outputs on the nodes STB01 and STT01 have varied, e.g., "high" output to STB01 and "low" output to STT01, until the signals SAEQB01 and SACM01 go "low", the NMOS transistors MN103 and MN106 having their gates connected to the node STT01 and the PMOS transistor MP105 having its gate connected to the node STB01 all turn off, causing the current ISA flowing through the current source MN105 to GND to become zero.

In contrast, in the first embodiment of FIG. 1, a current ISA flows during this period from the power source to the PMOS transistor MP104 having its gate connected to the node STT01, to the NMOS transistor MN101 having its gate supplied with the input signal CDB01 (VCC-V1 is higher than threshold voltage of NMOS transistor), to the current source MN105, and to GND. In the conventional sense amplifier shown in FIG. 3, the NMOS transistor MN201 having its gate connected to the node STT02 and the PMOS transistor MP105 having its gate connected to the node STB02 turn off during this period, causing the current ISA flowing through the current source MN205 to GND to subside.

The current ISA flowing through the MN105 based on this embodiment is compared in FIG. 7 with that of the first embodiment of FIG. 1 and the current flowing through the MN205 of the conventional sense amplifier shown in FIG. 3. The figure reveals that the second embodiment of FIG. 7 can reduce the current ISA relative to the first embodiment, and it is comparable to that of the conventional sense amplifier.

It was confirmed that the sense amplifier of the second embodiment made from CMOS of 0.4 $\mu$m process attains a delay time reduction $\Delta t$ of 0.6 ns as compared with the conventional sense amplifier and, at the same time, a load current of 200 $\mu$A (at 200 MHz) which is comparable to the conventional sense amplifier. Namely, it operates faster than the conventional sense amplifier at a comparable power consumption.

The sense amplifier of this embodiment also operates in response to the rises of the SACM01 signal to "high" and next the SAEQB01 signal to "high" (reversed order of rising of the signals against the case of FIG. 2) similarly to the first embodiment shown in FIG. 5, and it can reduce the delay time of output response on the node STB01 (or STT01) by $\Delta t1$.

Figure 8:
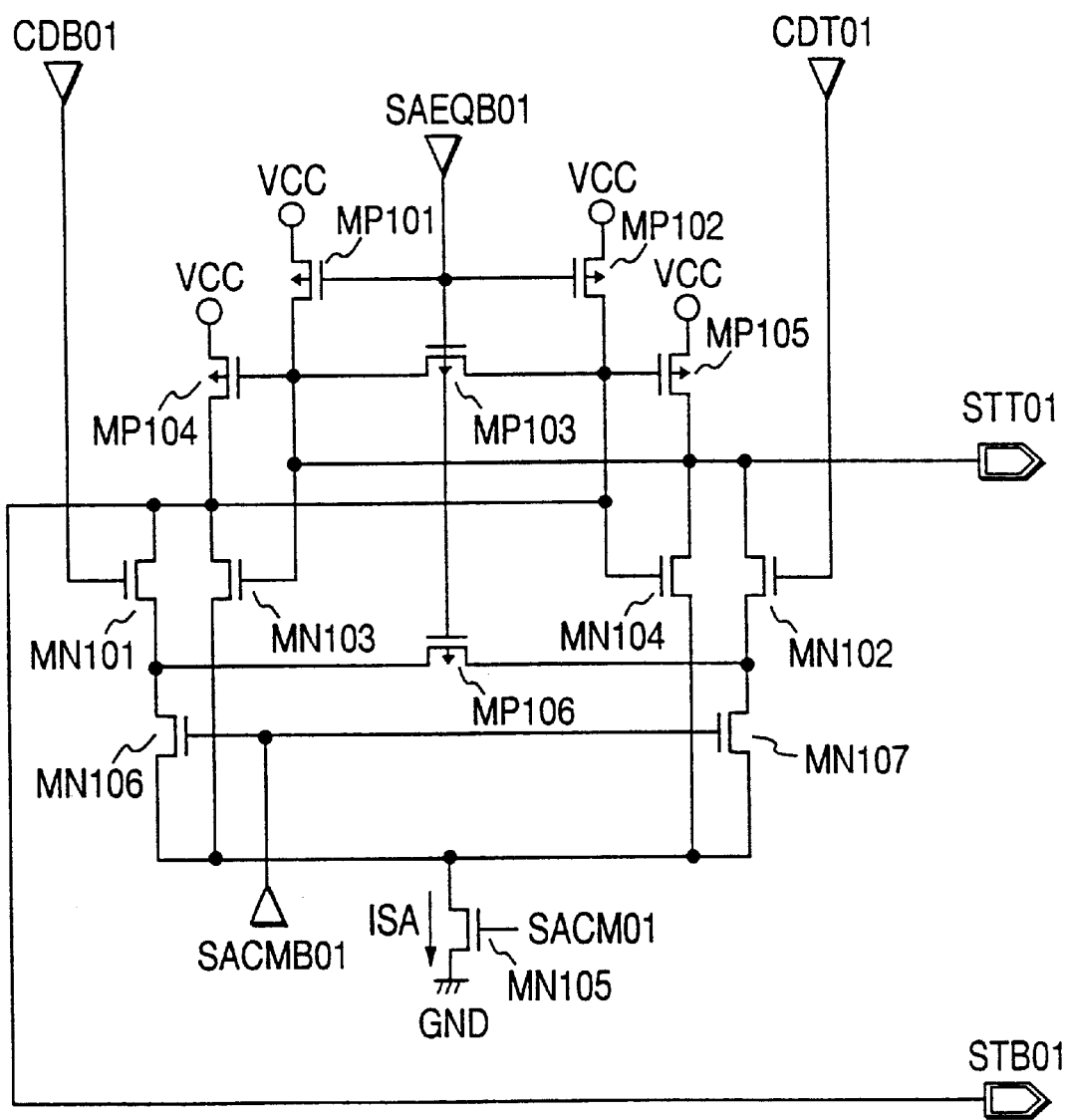
FIG. 8 is a schematic diagram of a sense amplifier accomplished by a semiconductor integrated circuit based on a third embodiment of this invention.

FIG. 8 shows a sense amplifier accomplished by a semiconductor integrated circuit based on the third embodiment of this invention. This sense amplifier, which is derived from the second embodiment of FIG. 6, has the NMOS transistors MN106 and MN107 connected to receive another signal SACMB01 on their gates.

The sense amplifier of this embodiment consists of a latch circuit formed of the PMOS transistors MP104 and MP105 and NMOS transistors MN103 and MN104 connected as shown in FIG. 1, the NMOS transistor MN101 connected in parallel to the MN103 of the latch circuit, the NMOS transistor MN106 connected in parallel to the MN103 and in series to the MN101 (and supplied on its gate with the signal SACMB01), the NMOS transistor MN102 connected in parallel to the MN104, the NMOS transistor MN107 connected in parallel to the MN104 and in series to the MN102 (and supplied on its gate with the signal SACMB01), and the NMOS transistor MN105 as a current source connected in series to the MN106, MN107, MN103 and MN104.

This sense amplifier reduces the output delay time in the same fashion as the second embodiment. In addition, by bringing the signal SACMB01 to "low" during the period after output signals have been led out to the nodes STB01 and STT01, e.g., "high" output to STB01 and "low" output to STT01, when the signal SAEQB01 is "low" and until the signal SACM01 goes "low", the NMOS transistors MN106 and MN107 having their gates supplied with the signal SACMB01 are turned off, whereby the increase of power consumption can be prevented similarly to the second embodiment as compared with the first embodiment of FIG. 1.

Figure 9:
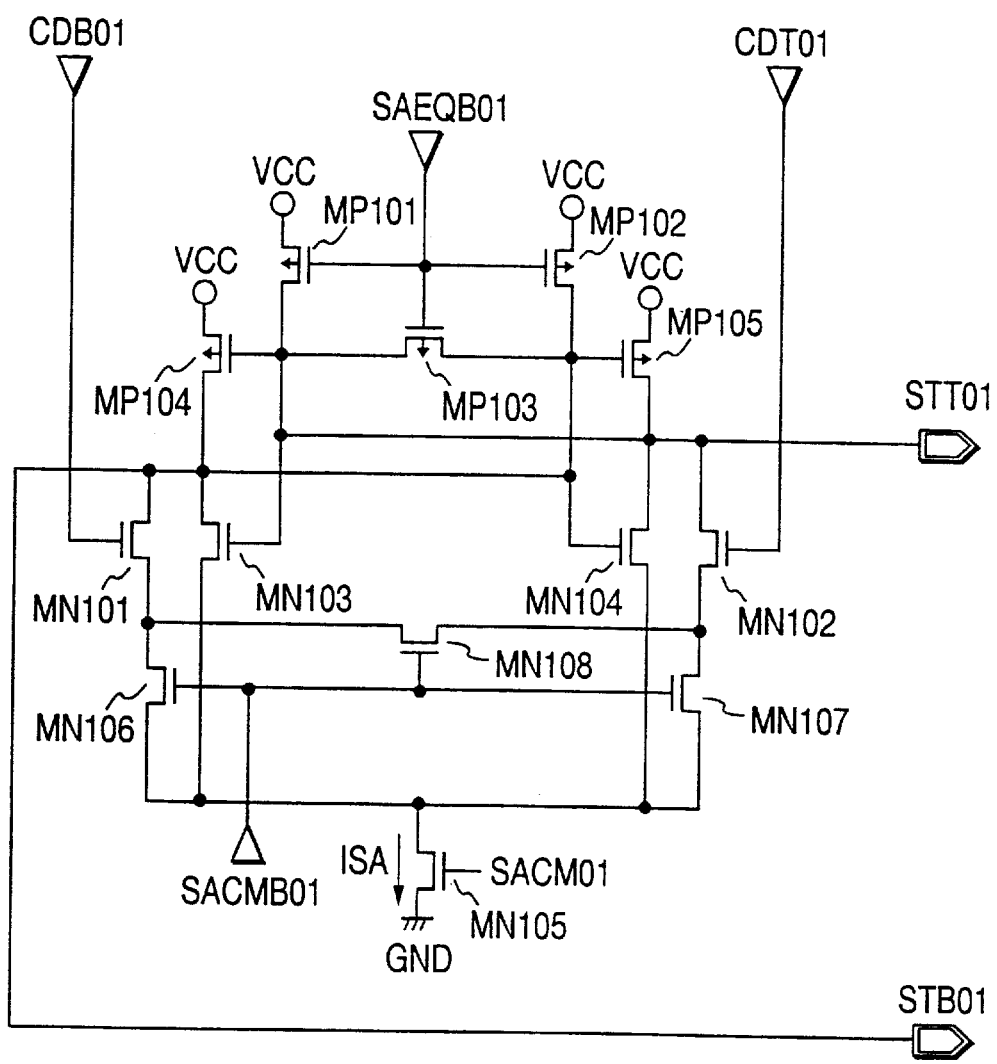
FIG. 9 is a schematic diagram of a sense amplifier accomplished by a semiconductor integrated circuit based on a fourth embodiment of this invention.

FIG. 9 shows a sense amplifier accomplished by a semiconductor integrated circuit based on the fourth embodiment of this invention. This sense amplifier, which is derived from the third embodiment of FIG. 8, includes an NMOS transistor MN108 in place of the PMOS transistor MP106, with its gate being supplied with the signal SACMB01. Namely, the sense amplifier of this embodiment is similar in arrangement to the third embodiment of FIG. 8.

This sense amplifier reduces the output delay time in the same fashion as the second embodiment. In addition, by bringing the signal SACMB01 to "low" during the period after output signals have been led out to the nodes STB01 and STT01, e.g., "high" output to STB01 and "low" output to STT01, when the signal SAEQB01 is "low" and until the signal SACM01 goes "low", the NMOS transistors MN106, MN107 and MN108 having their gates supplied with the signal SACMB01 are turned off, whereby the increase of power consumption can be prevented similarly to the second embodiment as compared with the first embodiment of FIG. 1.

Figure 10:
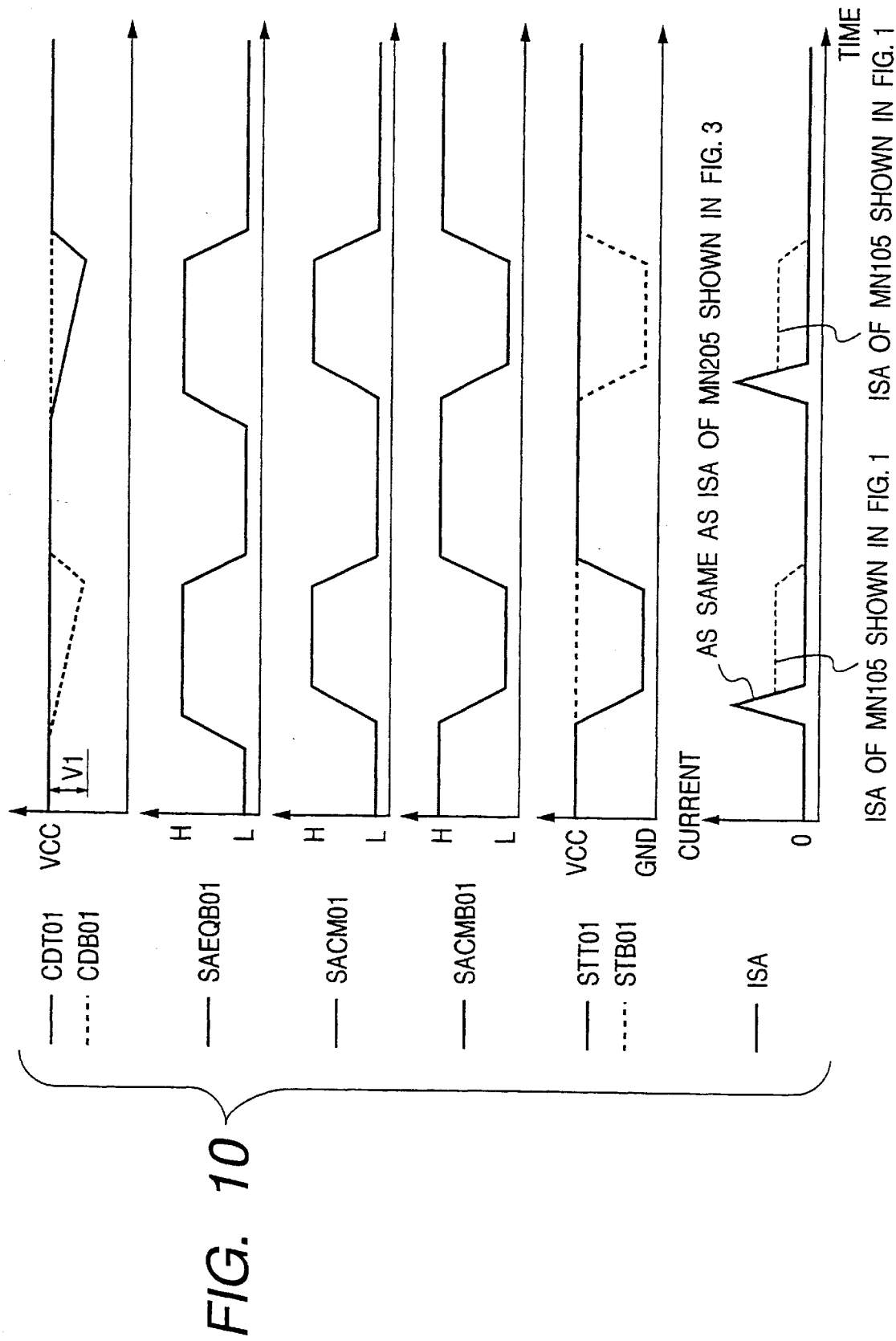
FIG. 10 is a waveform diagram explaining the operation of the sense amplifiers shown in FIG. 8 and FIG. 9.

FIG. 10 shows the signal waveforms of the sense amplifiers shown in FIG. 8 and FIG. 9. During the period after the outputs on the nodes STB01 and STT01 have varied, e.g., "high" output to STB01 and "low", output to STT01, until the signals SAEQB01 and SACM01 go "low", the NMOS transistor MN103 and PMOS transistor MP105 having their gates connected to the nodes STT01 and STB01 respectively, turn off, and the NMOS transistors MN106, MN107 and MN108 having their gates supplied with the signal SACMB01 are turned off by bringing the signal SACMB01 to "low" in this period, causing the current ISA flowing through the current source MN105 to GND to become zero.

The current ISA flowing through the MN105 based on this embodiment is compared in FIG. 10 with that of the first embodiment of FIG. 1 and the current flowing through the MN205 of the conventional sense amplifier shown in FIG. 3. Namely, the sense amplifiers of the third and fourth embodiments shown in FIG. 8 and FIG. 9 respectively have their currents ISA reduced relative to the first embodiment and comparable to the conventional sense amplifier.

It was confirmed that the sense amplifier of this embodiment made from CMOS of 0.4 $\mu$m process attains a delay time reduction $\Delta t$ of 0.6 ns as compared with the conventional sense amplifier and, at the same time, a load current of 200 $\mu$A (at 200 MHz) which is comparable to the conventional sense amplifier. Namely, it operates faster than the conventional sense amplifier at a comparable power consumption.

The sense amplifier of this embodiment also operates in response to the rises of the SACM01 signal to "high" and next the SAEQB01 signal to "high" (reversed order of rising of the signals against the case of FIG. 10) and the SACMB01 signal to "low" (the same as that of FIG. 10) similarly to the first embodiment shown in FIG. 5, and it can reduce the delay time of output response on the node STB01 (or STT01) by $\Delta t1$.

Figure 11:
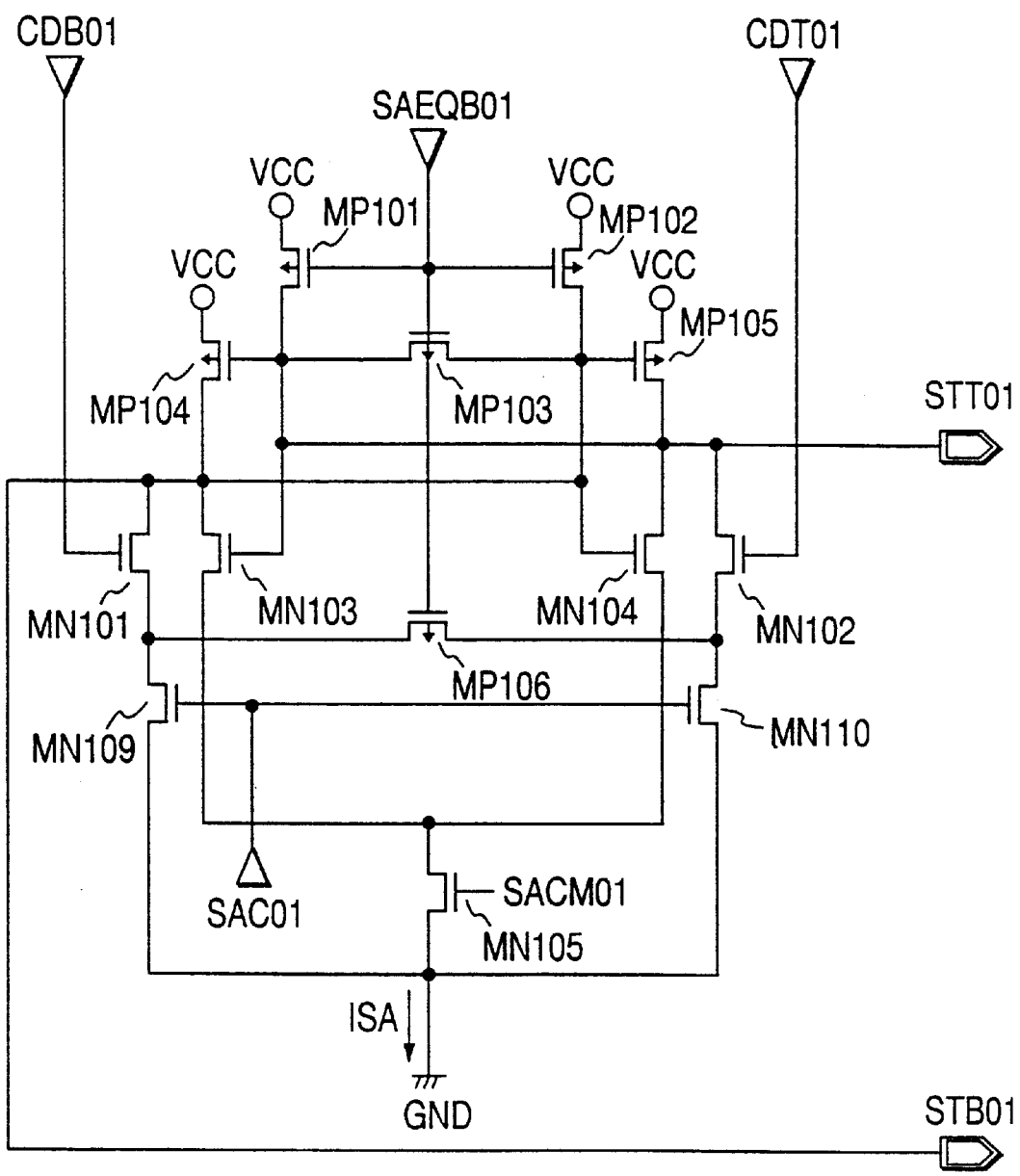
FIG. 11 is a schematic diagram of a sense amplifier accomplished by a semiconductor integrated circuit based on a fifth embodiment of this invention.

FIG. 11 shows a sense amplifier accomplished by a semiconductor integrated circuit based on the fifth embodiment of this invention. This sense amplifier, which is derived from the third embodiment of FIG. 8, includes source-grounded NMOS transistors MN109 and MN110 in place of the NMOS transistors MN106 and MN107, with their drains being connected to the sources of the NMOS transistors MN101 and MN102, respectively. Accordingly, the NMOS transistors MN103 and MN104 have their joint sources connected to the drain of the source-grounded NMOS transistor MN105. The NMOS transistors MN101 and MN102 have their sources connected to the drains of the source-grounded NMOS transistors MN109 and MN110, respectively. The MN109 and MN110 have their gates supplied with another signal SAC01.

The sense amplifier of this embodiment is made up of a latch circuit formed of the PMOS transistors MP104 and MP105 and NMOS transistors MN103 and MN104 connected as shown in FIG. 1, the NMOS transistor MN101 connected in parallel to the MN103 of the latch circuit, the NMOS transistor MN102 connected in parallel to the MN104, the current source NMOS transistor MN109 connected in series to the MN101 (and supplied on its gate with the signal SAC01), and the current source NMOS transistor MN110 connected in series to the MN102 (and supplied on its gate with the signal SAC01).

This sense amplifier operates similarly to the first embodiment as follows. The NMOS transistors MN101 and MN102 amplify a small voltage difference between the input signals CDT01 and CDB01, causing the voltage on the nodes STB01 and STT01 to vary. The NMOS transistors MN103 and MN104 amplify the varied voltages on the nodes STB01 and STT01. This circuit arrangement, in which a small voltage difference between the input signals CDT01 and CDB01 is amplified in two stages and the amplifying circuit is a 2-stage serial connection of the current source transistor MN105 and transistor MN103 (or MN104) and also a 2-stage serial connection of the current source transistor MN109 and transistor MN101 (or MN110 and MN102), can reduce the delay time of output response on the node STB01 (or STT01).

The signal SAC01 is brought to "high" simultaneously to the rise of the signal SACM01. By bringing the signal SAC01 to "low" during the period after output signals have been led out to the nodes STB01 and STT01 until the signals SAEQB01 and SACM01 go "low", the NMOS transistors MN109 and MN110 having their gates supplied with the signal SAC01 are turned off, whereby the increase of power consumption can be prevented as compared with the first embodiment of FIG. 1.

Figure 12:
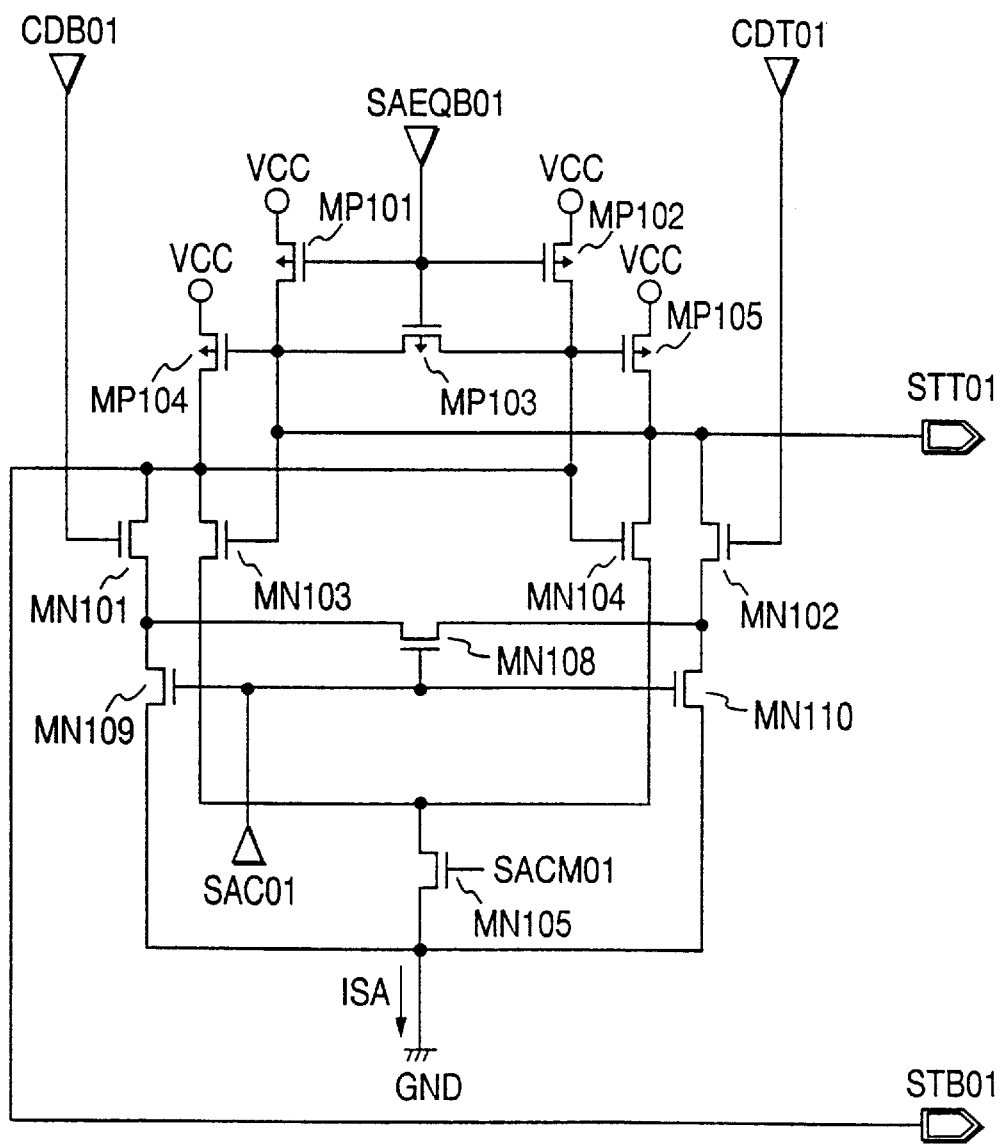
FIG. 12 is a schematic diagram of a sense amplifier accomplished by a semiconductor integrated circuit based on a sixth embodiment of this invention.

FIG. 12 shows a sense amplifier accomplished by a semiconductor integrated circuit based on the sixth embodiment of this invention. This sense amplifier, which is derived from the fourth embodiment of FIG. 9, includes source-grounded NMOS transistors MN109 and MN110 in place of the NMOS transistors MN106 and MN107, with their drains being connected to the sources of the NMOS transistors MN101 and MN102, respectively. Accordingly, the NMOS transistors MN103 and MN104 have their joint sources connected to the drain of the source-grounded NMOS transistor MN105. The NMOS transistors MN101 and MN102 have their sources connected to the drains of the source-grounded NMOS transistors MN109 and MN110, respectively. The MN109 and MN110 have their gates supplied with another signal SAC01. Namely, the sense amplifier of this embodiment is similar in arrangement to the fifth embodiment of FIG. 11.

This sense amplifier operates similarly to the first embodiment as follows. The NMOS transistors MN101 and MN102 amplify a small voltage difference between the input signals CDT01 and CDB01, causing the voltage on the nodes STB01 and STT01 to vary. The NMOS transistors MN103 and MN104 amplify the varied voltages on the nodes STB01 and STT01. This circuit arrangement, in which a small voltage difference between the input signals CDT01 and CDB01 is amplified in two stages and the amplifying circuit is a 2-stage serial connection of the current source transistor MN105 and transistor MN103 (or MN104) and also a 2-stage serial connection of the current source transistor MN109 and transistor MN101 (or MN110 and MN102), can reduce the delay time of output response on the node STB01 (or STT01).

The signal SAC01 is brought to "high" simultaneously to the rise of the signal SACM01. By bringing the signal SAC01 to "low" during the period after output signals have been led out to the nodes STB01 and STT01 until the signals SAEQB01 and SACM01 go "low", the NMOS transistors MN109, MN110 and MN108 having their gates supplied with the signal SAC01 are turned off, whereby the increase of power consumption can be prevented as compared with the first embodiment of FIG. 1.

Figure 13:
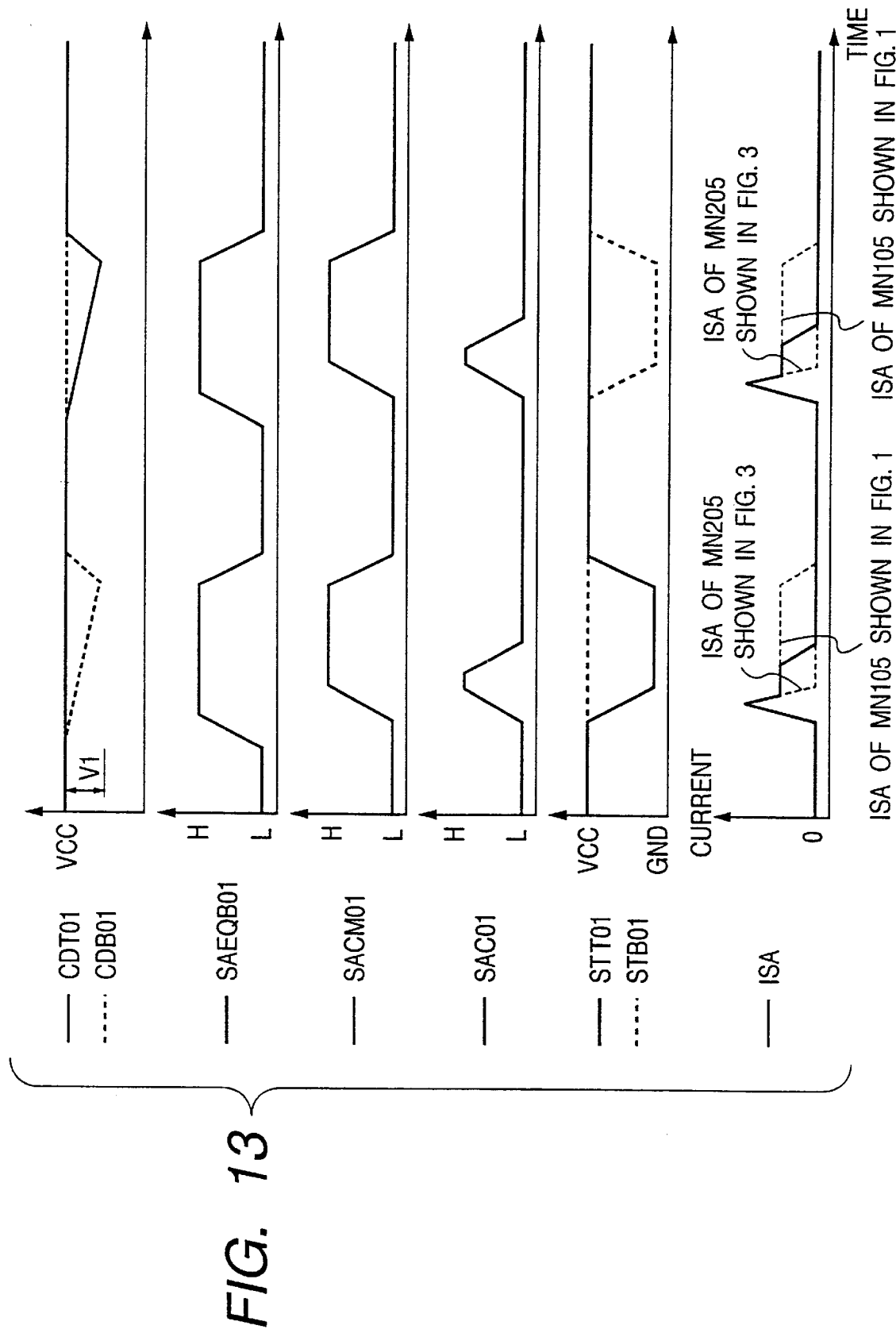
FIG. 13 is a waveform diagram explaining the operation of the sense amplifiers shown in FIG. 11 and FIG. 12.

FIG. 13 shows the signal waveforms of the sense amplifiers shown in FIG. 11 and FIG. 12. During the period after the outputs on the nodes STB01 and STT01 have varied, e.g., "high" output to STB01 and "low" output to STT01, until the signals SAEQB01 and SACM01 go "low", the NMOS transistor MN103 and PMOS transistor MP105 having their gates connected to the nodes STT01 and STB01 respectively, turn off, and the NMOS transistors MN109, MN110 and MN108 having their gates supplied with the signal SAC01 are turned off by bringing the signal SAC01 to "low" in this period, causing the current ISA flowing through the current source MN105, MN109 and MN110 to GND to become zero.

The current ISA flowing through the MN105 based on this embodiment is compared in FIG. 13 with that of the first embodiment of FIG. 1 and the current ISA flowing through the MN205 of the conventional sense amplifier shown in FIG. 3. Namely, the sense amplifiers of the fifth and sixth embodiments shown in FIG. 11 and FIG. 12 have their currents ISA reduced relative to the first embodiment, and operate faster than the conventional sense amplifier at a comparable power consumption.

It was confirmed that the sense amplifier of this embodiment made from CMOS of 0.4 μm process attains a delay time reduction Δt of 0.6 ns as compared with the conventional sense amplifier. Namely, it operates faster than the conventional sense amplifier.

Figure 14:
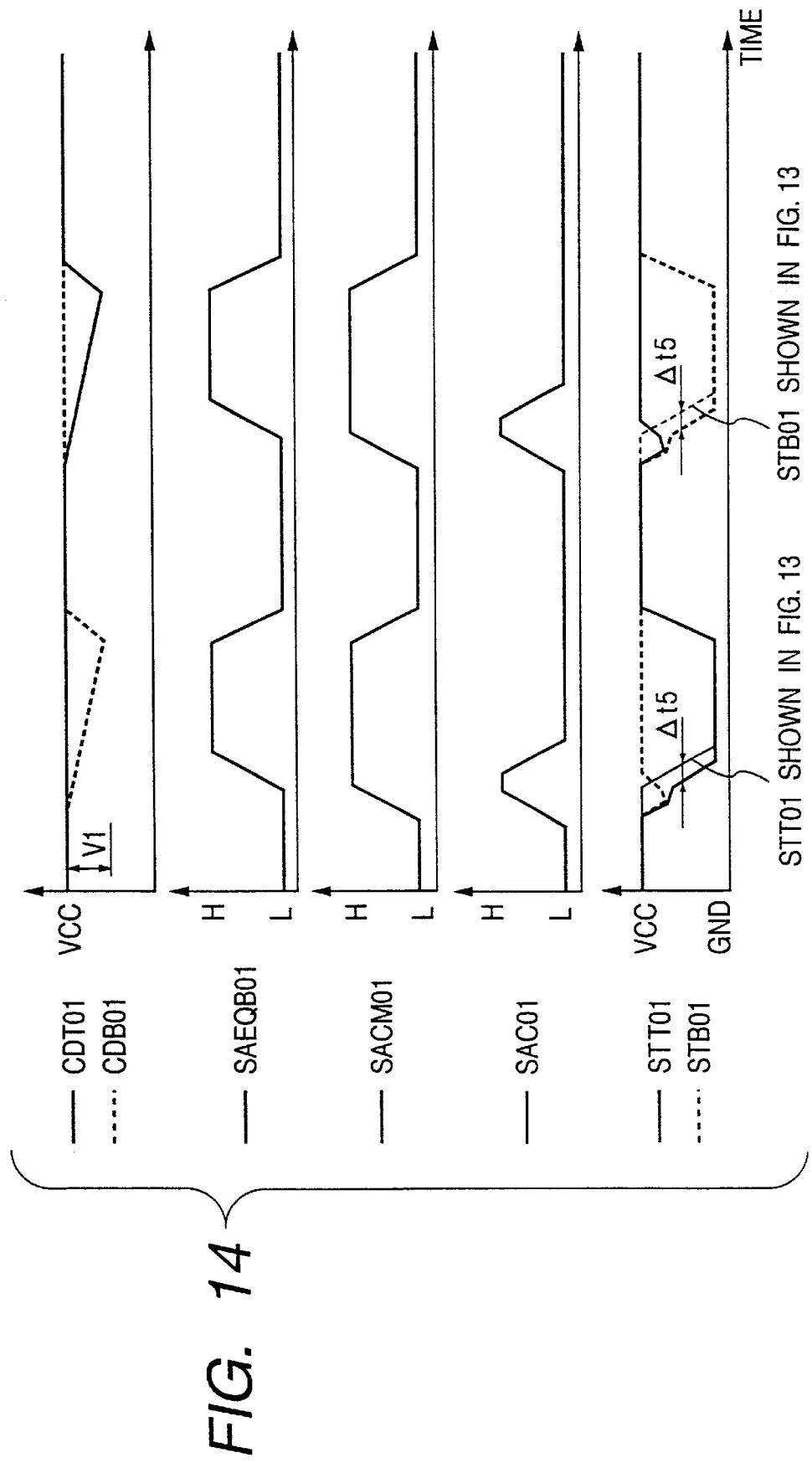
FIG. 14 is a waveform diagram explaining the operation of the sense amplifiers shown in FIG. 11 and FIG. 12.

The sense amplifier of this embodiment operates similarly to the first embodiment shown in FIG. 5 also in response to the rises of the SACM01 signal to "high" and next the SAEQB01 signal to "high" (reversed order of rising of the signals against the case of FIG. 13) and to the rise and fall of the signal SAC01 simultaneously to the rise of SACM01 and fall of SAEQB01, respectively, and it can reduce the delay time of output response on the node STB01 (or STT01) by Δt5, as shown in FIG. 14.

As will be appreciated from the foregoing embodiments, the present invention reduces the response time of the sense amplifier after a voltage difference arises between the input signals and the amplifier is rid of being reset and is activated until it delivers an amplified voltage difference.

The inventive sense amplifier reduces the response time without imposing the increase of power consumption relative to the conventional sense amplifier.

The inventive sense amplifier has a reduced number of transistors as compared with the conventional sense amplifier, contributing to the reduction of chip area, and consequently to the enhancement of yield and the reduction of manufacturing cost.

While the present invention has been described for its preferred embodiments, changes and modifications can be made without departing from the spirit of the invention.

What is claimed is:

1. A sense amplifier circuit comprising:
    a differential amplifying circuit including a first transistor and a second transistor;
    a latch circuit including a first inverter, a second inverter, a first node, and a second node, an input of the first inverter being coupled with an output of the second inverter at the first node, and an input of the second inverter being coupled with an output of the first inverter at the second node;
    a first input signal line coupled to a gate of the first transistor;
    a second input signal line coupled to a gate of the second transistor;
    a first output signal line coupled to the first node and a drain of the first transistor;
    a second output signal line coupled to the second node and a drain of the second transistor;
    a third transistor having a gate coupled to the second node and a drain coupled to the source of the first transistor;
    a fourth transistor having a gate coupled to the first node and a drain coupled to the source of the second transistor;
    a current source coupled to sources of said third and fourth transistors; and
    a precharge circuit coupled to said first and second nodes, wherein said current source is activated before said precharge circuit is deactivated.

2. A sense amplifier circuit according to claim 1, wherein the first inverter includes fifth and sixth transistors, the fifth transistor being connected in series to the sixth transistor, wherein the second inverter includes seventh and eighth transistors, the seventh transistor being connected in series to the eighth transistor, and wherein sources of the sixth and eighth transistors are connected to the current source.

3. A sense amplifier circuit according to claim 2, wherein the precharge circuit precharges the first and second nodes to a precharge voltage.

4. A sense amplifier circuit according to claim 3, wherein said precharge circuit has a ninth transistor which has a source-drain path connected between the first node and the second node, a tenth transistor which has a source-drain path connected between the precharge voltage and the first node, and an eleventh transistor which has a source-drain path connected between the precharge voltage and the second node, and wherein drains of the fifth and seventh transistors are supplied with a voltage equal to the precharge voltage.

5. A sense amplifier circuit according to claim 4, wherein the ninth, tenth, and eleventh transistors are P-type transistors, and wherein the third and fourth transistors are N-type transistors.

6. A sense amplifier circuit according to claim 1, wherein said precharge circuit precharges the first and second nodes to a precharge voltage.

7. A sense amplifier circuit according to claim 6, wherein said precharge circuit has a fifth transistor which has a source-drain path connected between the first node and the second node, a sixth transistor which has a source-drain path connected between the precharge voltage and the first node, and a seventh transistor which has a source-drain path connected between the precharge voltage and the second node.

8. A sense amplifier circuit comprising:

a first transistor having a drain connected to a first node;

a second transistor having a drain connected to a second node;

a latch circuit connected to the first and second nodes;

a first input line connected to a gate of the first transistor;

a second input line connected to a gate of the second transistor;

a first output line connected to the first node;

a second output line connected to the second node;

a precharge circuit connected to the first and second nodes; and a current source connected to a source of said first transistor via a third transistor and a source of said second transistor via a fourth transistor, wherein a gate of the third transistor is connected to the second node and a gate of the fourth transistor is connected to the first node, and wherein its precharging operation of said precharge circuit is deactivated after said current source is activated.

9. A sense amplifier circuit according to claim 8, wherein said precharge circuit supplies a first voltage to the first and second nodes, and wherein said latch circuit has fifth, sixth, seventh, and eighth transistors, the fifth transistor being connected in series to the sixth transistor between the first voltage and said current source at the first node, and the seventh transistor being connected in series to the eighth transistor between the first voltage and said current source at the second node.

10. A sense amplifier circuit according to claim 9, wherein said precharge circuit has ninth, tenth, and eleventh transistors, the ninth transistor being connected between the first and second nodes, the tenth transistor being connected between the first voltage and the first node, and the eleventh transistor being connected between the first voltage and the second node.

* * * * *